United States Patent
Ek

(10) Patent No.: US 9,155,223 B2
(45) Date of Patent: Oct. 6, 2015

(54) THERMALLY CONTROLLED ASSEMBLY

(75) Inventor: Claus Ek, Farum (DK)

(73) Assignee: NaPatech A/S, Søborg (DK)

( * ) Notice: Subject to any disclaimer, the term of this patent is extended or adjusted under 35 U.S.C. 154(b) by 402 days.

(21) Appl. No.: 13/642,577

(22) PCT Filed: Apr. 19, 2011

(86) PCT No.: PCT/EP2011/056256
§ 371 (c)(1),
(2), (4) Date: Jan. 25, 2013

(87) PCT Pub. No.: WO2011/131684
PCT Pub. Date: Oct. 27, 2011

(65) Prior Publication Data
US 2013/0114208 A1    May 9, 2013

Related U.S. Application Data

(60) Provisional application No. 61/327,339, filed on Apr. 23, 2010.

(51) Int. Cl.
*H05K 7/20* (2006.01)
*H05K 1/14* (2006.01)

(52) U.S. Cl.
CPC .......... *H05K 7/20136* (2013.01); *H05K 7/2049* (2013.01); *H05K 7/20145* (2013.01); *H05K 7/20163* (2013.01); *H01L 2924/0002* (2013.01); *H05K 1/144* (2013.01); *H05K 2201/042* (2013.01)

(58) Field of Classification Search
CPC ........... H05K 1/14; H05K 1/20; H05K 1/141; H05K 3/368
USPC .................................................. 361/694–700
See application file for complete search history.

(56) References Cited

U.S. PATENT DOCUMENTS

| | | |
|---|---|---|
| 5,838,066 A | 11/1998 | Kitajo |
| 5,912,802 A | 6/1999 | Nelson |
| 6,109,340 A | 8/2000 | Nakase et al. |
| 6,125,924 A | 10/2000 | Lin |

(Continued)

FOREIGN PATENT DOCUMENTS

| | | |
|---|---|---|
| DE | 102005035387 B4 | 7/2007 |
| EP | 0154719 A2 | 12/1984 |

(Continued)

OTHER PUBLICATIONS

Patent Cooperation Treaty, "International Search Report and Opinion" by Authorized Officer Angela Debra, mailed Apr. 19, 2011, in International Patent Application No. PCT/EP2011/056256; pp. 1-8.

*Primary Examiner* — Anthony Haughton
*Assistant Examiner* — Matt Dhillon
(74) *Attorney, Agent, or Firm* — McHale & Slavin, P.A.

(57) ABSTRACT

A thermally controlled assembly having two parallel PCBs defining there between, and by the aid of a channel forming element, a channel in which air is forced, using a fan, to cool components in the channel. The fan has a cooling surface cooled by air from the fan and which is biased toward an element provided in a space below the cooling surface. The forced air also drawing air from outside the assembly through the space and into the channel to cool other elements provided in the space.

11 Claims, 2 Drawing Sheets

(56) References Cited

U.S. PATENT DOCUMENTS

| | | | |
|---|---|---|---|
| 6,130,820 A | 10/2000 | Konstad et al. | |
| 6,934,152 B1* | 8/2005 | Barrow | 361/690 |
| 7,042,734 B2* | 5/2006 | Hensley et al. | 361/758 |
| 7,447,024 B1* | 11/2008 | Chou | 361/695 |
| 7,619,900 B2* | 11/2009 | McClure et al. | 361/752 |
| 7,969,733 B1* | 6/2011 | Abbay et al. | 361/695 |
| 7,990,712 B2* | 8/2011 | Fang | 361/700 |
| 2007/0125517 A1 | 6/2007 | Schaper | |
| 2009/0194260 A1* | 8/2009 | Liao et al. | 165/104.33 |
| 2010/0128431 A1* | 5/2010 | Eriksen et al. | 361/679.47 |

FOREIGN PATENT DOCUMENTS

| | | |
|---|---|---|
| GB | 2358464 A | 7/2001 |
| JP | 64-13751 | 1/1989 |
| JP | 2-058900 | 2/1990 |
| JP | 6-275750 | 9/1994 |
| JP | 6332148 A | 12/2006 |
| JP | 9293982 A | 12/2009 |

* cited by examiner

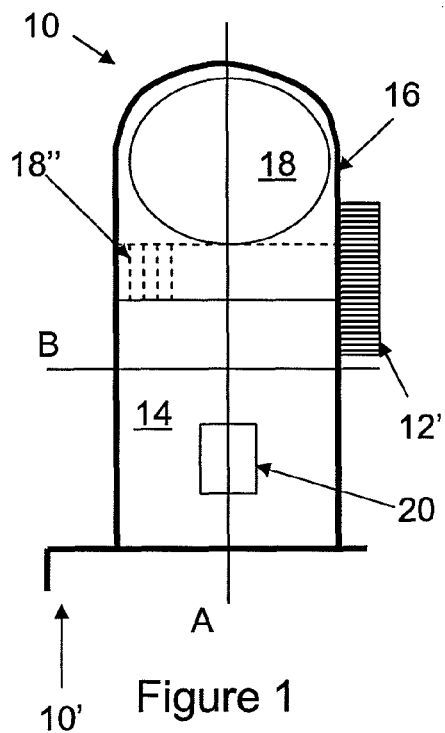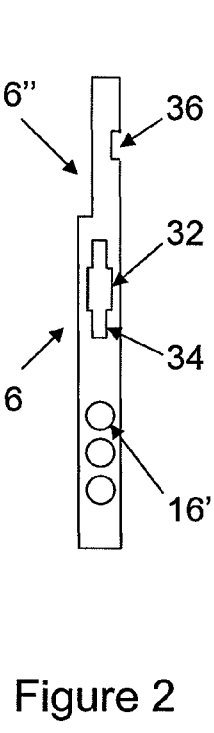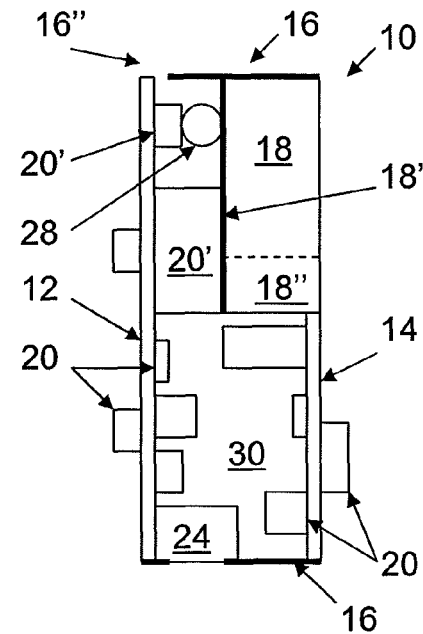
Figure 1　　Figure 2　　Figure 3
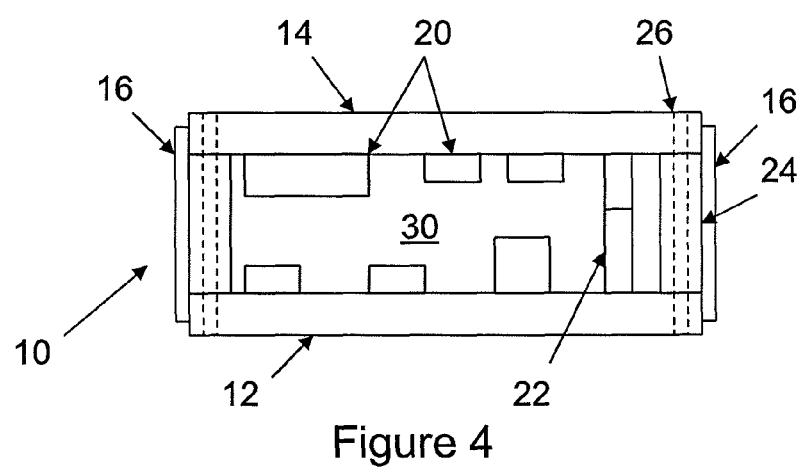
Figure 4

THERMALLY CONTROLLED ASSEMBLY

CROSS-REFERENCE TO RELATED APPLICATIONS

This application is a §371 national stage entry of International Application No. PCT/EP2011/056256, filed Apr. 19, 2011, which claims priority to U.S. Provisional Patent Application No. 61/327,339 filed Apr. 23, 2010, the entire contents of which are incorporate (herein by reference.

The present invention relates to a method of cooling electronic components using a channel in which cooling air is passed. Technologies like this are known from e.g. HiFi amplifiers in which cooling elements with cooling fins are positioned with the fins directed inwardly into the channel in which a fan drives cooling air. The electronic components are positioned on the outer sides of the cooling elements.

Presently, the cooling is performed on components positioned at or fixed to PCBs and especially the forming, using the PCBs, of a channel through which air is forced in order to cool the components In a first aspect, the invention relates to an assembly comprising:
- a first PCB with a first side and a second side, one or more first electrical components being positioned at the first side of the first PCB,
- a second PCB with a first side and a second side, one or more second electrical components being positioned at the first side of the second PCB, the first side of the first PCB facing the first side of the second PCB,
- a channel forming element forming, with at least part of the first sides of the first and second PCBs a channel having a first end and a second end, a slit being provided in the channel forming element, and
- an air forcing element positioned to force air through the channel from the first end thereof toward the second end thereof, the air forcing element comprising a cooling surface and biasing elements biasing the cooling surface against at least one component of the first or second components, the cooling surface defining a space wherein the at least one component is positioned,
- the slit being positioned so that air may be drawn there through, due to the venturi effect, and into the space and into the channel.

The present invention provides a number of advantages in that space may be saved without loosing cooling of the components. Thus, when the first sides of the PCBs are used to shape or form the channel, direct cooling of the components positioned in the channel is obtained and no additional elements are required to form the cooling channel. In addition, the channel forming element may also be provided rather stiff and thus also act to stiffen the assembly. This is especially relevant when, as is described further below, this element is also used for engaging biasing means.

In the present context, an assembly is a number of elements operating together and/or being connected to each other, such as fixed to each other. Naturally, the fixing may be obtained in a detachable manner, and any inter-operation may be carried out via wires, wirelessly, via mechanical coupling, or the like.

An electronic component may be any type of component from a simple resistor to a chip of any kind. Thus, components may be processors, FPGAs, memory circuits, resistors, capacitors, coils/inductors or the like.

Usually, a PCB is a printed circuit board, which is a flat element with two primary sides and a rim portion. A PCB may have one or more layers of conductors and may have electrical components on one side thereof or on the two primary sides thereof. Usually, the electrical components will be able to inter-operate by sending/receiving power and/or signals between each other via conductors in the PCB. Normally, the components are fixed to the PCB, such as via conductors thereof.

When the first sides of the PCBs face each other, these sides form sides of the channel in which electrical components positioned at the first sides are positioned so as to be cooled by the air flow generated by the air forcing element.

Preferably, the first and second PCBs are parallel, which means that the general planes thereof, which will be the major planes of the PCBs in the situation where these are flat elements, are parallel. In this situation, the edge portions of the PCBs may be positioned with the same distance there between so that the channel forming element may have the same thickness at the positions at which the channel is formed.

In this context, the channel forming element is adapted to form the channel together with the PCBs, such as the first sides of the PCBs and the electrical components positioned at the first sides at the parts of the PCBs forming the channel.

Naturally, the channel may be straight, curved or meandering, both in a plane of one or both of the first sides or perpendicular thereto. It is noted that the components positioned at the first sides may cause the channel to be irregular in internal dimensions so that the air flow therein is affected.

It is noted that also in the situation where the PCBs are parallel (main planes when the PCBs are flat elements), the channel forming element needs not be positioned at straight sides of the PCBs but may define the channel over only a part of the first surfaces also across a width of the channel perpendicular to the overall direction of the channel from the first end to the second end.

The forming of the channel will be the providing of elements causing the air to flow generally from the first end to the second end. Naturally, the channel forming element needs not seal the channel in an air tight manner along the full length of the channel. Small openings through which air may enter or exit the channel are acceptable and may actually aid in the venting and cooling, as long as the desired air flow is maintainable in the channel.

The channel preferably has a first end and a second end at which air may enter or exit the channel. The entering/exiting of air into/from the channel may be via one or more openings. Other openings may be positioned not at the ends in order to obtain a desired air flow in the channel.

The simplest manner of forming the channel is to have the channel forming element simply provide a sealing between edges of the PCBs thus forming the channel using the full width of the PCBs across the general direction of the channel (such as from the first to the second end). However, the channel may be made more narrow than that by having the channel forming element engage or seal not at the edge(s) of one or both PCBs but seal or engage at the first surface thereof. Thus, one PCB may be wider, in the direction across the general direction of the channel, than the other, so that the channel could take up the full width of one of the PCBs but not the other, or the channel forming element engages or seals at the first surface of both PCBs and may then be more narrow than the width, across the general direction of the channel, of both PCBs.

Usually, the channel will have a general direction along a longitudinal axis of one or both PCBs, so that the ends will be at or near the edges of this/these PCB(s) at the ends thereof.

A number of means and manners exist for forcing air into e.g. a channel. Fans, compressed air or the like may be used. Providing suction at one end of the channel will force the air in one direction through the channel and providing an increased pressure (operating e.g. a fan in the opposite direction) will force the air in the other direction through the channel. The desired direction of the air will depend on the positions of the components in the channel and in particular the position of the most heat generating and most heat sensitive of the components within the channel.

It may be desired that the coolest air, i.e. air that has not been used for cooling a number of the components, is provided firstly to the most heat sensitive elements in order to first and foremost ensure cooling of these elements. Alternatively, it may be desired to position the most heat generating components close to the point of exit of the air from the channel in order for the heated air generated thereby to not be provided to other components, which could heat these instead of cooling these components.

Thus, the direction of flow of the air in the channel as well as the positions of individual components may be used for tailoring the cooling of individual components.

As mentioned, the air may be forced into the channel at one end and output at the other. Usually, the channel has one or more openings at the ends thereof in order to facilitate this air flow. Other openings may also be provided if desired.

The air forcing element comprises a cooling surface and biasing elements biasing the cooling surface against at least one component of the first or second components. Thus, whereas the components in the channel formed by e.g. overlapping parts of the first and second PCBs are cooled by the air flowing through the channel, some components are alternatively or additionally cooled directly by the cooling surface biased there on. It is noted that the cooling surface would usually be biased only on the highest of the components, whereas cooling of lower components (in the direction perpendicular to the plane of the PCB) is then obtained by air flow or by providing a thermally conducting element or material between such components and the cooling surface. Also, or in addition, such lower components can be cooled by providing a thermally conducting element or material between such components and the cooling surface.

In one embodiment, the assembly further comprises one or more openings positioned at or near the second end of the channel. As mentioned above, one or more of such openings may be positioned in the channel forming element.

In that or another embodiment:
the first PCB has a first outline, in a plane thereof,
the second PCB has a second outline, in the plane, at least a part of the first and second outlines being overlapping,
the channel forming element blocking or closing any opening between the first and second PCBs at least part of a boundary of the overlapping part of the outlines.

Thus, the outlines of the first and second PCBs overlap, and the channel forming element may use the overlapping parts of the PCBs to form the channel.

In a particularly interesting embodiment, the first PCB covers a first area, in a plane thereof, the second PCB covers a second area in the plane, the second area being positioned within the first area, and the air forcing element covers a third area, in the plane, the third area being positioned within a part of the first area not covered by the second area. Thus, the air forcing element may be positioned adjacent to the second PCB and over a part of the first surface of the first PCB. Again, the channel will be formed where the first and second areas overlap, and an opening for air exit/entering may be positioned at an interface between the second and third areas. As will be described further below, this brings about advantages.

Preferably the second and third areas do not overlap but together cover or correspond to the first area in order to utilize the space of the assembly as optimally as possible.

In this embodiment, in the plane, the air forcing element is preferably positioned closer to the first end of the channel than the second end of the channel. Thus, the air forcing element is used for forcing air from outside the assembly through the air forcing element and into the channel. The air will then flow through the channel and the components positioned therein and out at the other end of the channel.

An embodiment which is easy to set up is one wherein the first and second PCBs are at least substantially parallel. In this situation, the channel forming element may have the same thickness or extent in the direction perpendicular to the plane of the PCBs in order to obtain its function.

In order to increase the cooling of the cooling surface, the air forcing element preferably comprises a number of fins through which the air entering the channel passes and which are thermally connected to the cooling surface.

In general, it is preferred that the biasing elements comprise at least three resilient elements having at least substantially the same spring constant, the resilient elements being positioned so that the force exerted by the biasing elements and the air forcing element on the at least one component is perpendicular to a plane of the PCB at which the at least one component is positioned.

In this respect, a resilient element may be any type of resilient element, such as a spring, helical or blade spring, a foam, a solid material, such as rubber, plastics, polymer or the like. Naturally, also more complicated technologies, such as compressible gas cylinders or the like may be used if desired. The spring or resilient constant of the resilient element will usually describe the force required to perform a predetermined deformation/compression of the element in a particular direction.

When the force is perpendicular to the plane, the cooling surface will be able to contact at least substantially all of an upper surface of the component, which normally is a flat component having an upper surface parallel with the plane of the PCB. This optimizes the cooling of this component.

In addition, providing the force perpendicular to the plane of the PCB ensures that the biasing does not stress any attachment of the component to the PCB.

In a very interesting embodiment, the biasing elements are positioned so that, along each of two axes perpendicular to each other and positioned in the plane, a first combined distance from a centre of the at least one component to each biasing element positioned in one direction along the axis in relation to the centre is within a predetermined distance from a second combined distance from the centre to each biasing element positioned in the opposite direction along the axis in relation to the centre. Ideally and preferably, the predetermined distance is zero, but manufacturing imperfections and other considerations may dictate that a certain deviation there from is tolerated. Thus, this distance may be up to 10% of a largest distance from any resilient means to the centre of the component.

Thus, for each of the two axes the directions are determined from the centre of the component; the distances along the two directions are simply added up.

It may be irrelevant how the axes are chosen. The relevant part is that the force exerted on the component relates to the distance from the centre to the resilient element and the force exerted, which preferably is the same for all resilient elements.

This embodiment is particularly relevant when the biasing elements cannot be positioned symmetrically around the component with the same distances to the centre of the component. This may be the case where electronic components, the air forcing element or the like prevent this or make it difficult. The choice that the biasing elements should have the same resiliency or spring constant then makes selection of such positions difficult.

The above determination of the positions, however, ensures that the force remains perpendicular to the plane of the PCB even when the spring constants are identical. Thus, the same, advantageous effect may now be obtained also for non-symmetrical positions of the resilient means.

It is noted that a certain deviation of the direction of the force from perpendicular to the plane of the PCB is allowable. Thus, the spring constants may vary from each other by a predetermined amount or percentage, usually caused by manufacturing imperfections.

As mentioned above, the distances to the centre of the component may deviate by a predetermined amount or percentage, as long as the direction of the force remains within tolerable angles of the perpendicular direction.

Thus, usually, it would be acceptable that the spring constants vary with up to 10% of a mean value of the constants of the resilient elements. Also, it would normally be acceptable that the distances of the individual biasing elements to the centre vary with up to 10% from an optimum or perfect position.

It is noted that an additional advantage is seen when the biasing elements engage the channel forming element and not e.g. the PCB. When engaging the PCB and deriving there from the force exerted by the resilient elements, the PCB will be affected thereby and flex. This may destroy the PCB over time, also due to the vibrations and temperature variations normally seen in computers.

A second aspect of the invention relates to a method of operating the assembly of the first aspect, the method comprising:

providing power to the electrical components of the first PCB, providing power to the electrical components of the second PCB, operating the air forcing element to force air from the air forcing element through the first end of the channel and toward the second end of the channel and to draw air through the slit and the space and into the channel.

In the following, preferred embodiments will be described with reference to the drawing, wherein:

FIG. 1 illustrates a preferred embodiment from above,

FIG. 2 illustrates the embodiment of FIG. 1 from the side,

FIG. 3 illustrates a cross section of the embodiment of FIG. 1,

FIG. 4 illustrates a cross section of the embodiment of FIG. 1,

Figure 5:
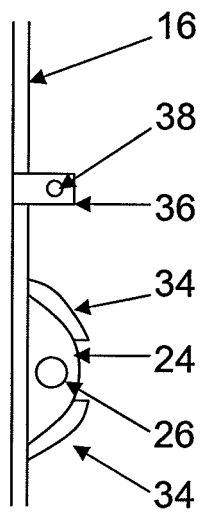
FIGS. 5 and 6 illustrate fixing means of the embodiment of FIG. 1.
Figure 6:
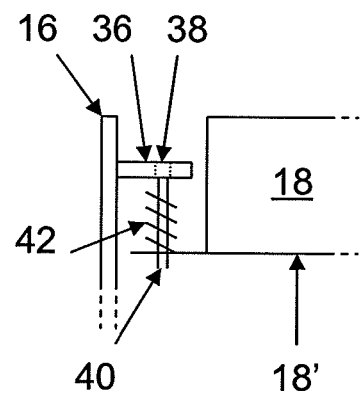

In FIG. 1, a data processing assembly 10 is illustrated from above. In FIG. 2, it is illustrated as a side view, in FIG. 3 as a cross section along the A-line and in FIG. 4, a cross section along the B-line is illustrated. In FIGS. 5 and 6, details relating to the assembling of the assembly 10 are illustrated.

The assembly 10 comprises two printed circuit boards (PCB) 12 and 14, kept in position in relation to each other by an outer strengthening element 16, as well as a ventilator or fan 18. It is seen that the area defined, in the plane of the PCBs 12/14, is taken up by the PCB 12 alone or the PCB 14 along with the fan 18.

The PCBs comprise electronic components 20 on at least the sides thereof facing each other, but components may also be provided on the sides facing away from each other.

The operation of the electrical components of the assembly 10 is that the components 20/20' are powered and receive/generate/output data as desired. Also, the components may comprise a power supply and input/output means as indicated at 24. Also, the PCBs may each comprise a plug 22 which is adapted to interconnect the PCBs electrically in order to interchange power/signals/information or the like.

The assembly may operate as a PCI card via externally accessible terminals 12'. Also, the assembly may have a bracket 10' as is required for PCI cards.

The operation of the cooling of the present assembly is that the fan 18 forces air into the assembly 10 and into a channel 30 defined by the PCBs 12/14 and the element 16 (see FIG. 4). This air will exit the channel 30 at the other (lower in FIG. 1) end of the assembly 10, such as through openings 16' in the element 16.

The fan 18 preferably has (see FIG. 3) a lower surface 18' between the actual fan and electrical components 20' positioned there under in order to increase the cooling thereof. Naturally, these components 20' may have different heights, and the fan 18 may be forced, such as by a spring biasing, toward the highest of such components, and a thermally conducting material, such as a paste, glue or foam, 28 may be provided between such lower components and the lower surface 18'.

In addition, the fan 18 has a number of parallel fins 18'', indicated in FIG. 1, through which the air entering the channel 30 passes and which are thermally connected to the lower surface 18' in order to increase the cooling thereof.

The components which are cooled the best are the components 20', which usually will be the most power consuming, and thus heat producing, components. Naturally, the position of a component as a component 20' at the surface 18', a component 20 within the channel 30 or a component 20 positioned on the outer side of a PCB 12/14 will depend on the heat generation of this component during operation as well as the component's ability to withstand high temperatures.

Due to the flow of air through the channel 30 and due to a slit 16'' provided in the element 16, air may also, due to the Venturi effect, be drawn into the space in which the components 20' are positioned and into the channel 30. This provides an increased cooling of the elements 20' and also draws cold air, also cooled by the lower side of the element 18' facing the elements 20', into the channel 30.

Assembly of the assembly 10 is performed in the following manner (see in particular FIGS. 2, 5 and 6):

The strengthening element 16 is provided with a number of areas with a central cut-out 32 and punched-out fins 34 which are used to fix elements 24 through which a channel 26 is provided. The elements 24 have a part fitting within the cut-out 32 so as to fix these in the direction across the longitudinal direction of the element 16, and the fins 34 thus will fix the element 24 to the element 16. The PCBs 12/14 then may be fixed to each other and the elements 24 and thus strengthening element 16, using a bolt and nut through the channels 26.

The fan 18 is attached to the strength element 16 via a spring biasing in order to maintain a sufficient thermal connection to the elements 20' and the thermally conducting material 28. Thus, a plurality of parts 36 of the element 16 are bent to be positioned over the fan 18, and a pin 40 is provided in a hole 38 in each part 36 for guiding a spring 42 then provided between the part 36 and the fan 18 to force the fan 18 away from the parts 36 and toward the elements 20'. Using the parts 36 of the strengthening element 16 for biasing the fan 18 instead of a fastening in relation to the PCB 12 saves space on the PCB 12. In addition, the force may be applied to the component 20' without having to derive the force from the PCB 12, which would be the case, if the springs 42 were connected to the PCB and not the strengthening element 16.

Due to the biasing, it is preferred that the elements 36 are positioned such, in relation to a centre of the highest of the components 20' that the force applied is balanced. This is illustrated in FIG. 7.

This may be obtained in multiple manners. Resilient elements 42 with different spring constants may be used, depending on the positions of the parts 36 in relation to the centre of the highest component 20', or the positions of the parts 36 may be selected so that identical springs 42 or at least elements with the same spring constants may be used.

Having the force and torque applied (force and distance to the centre of the highest component 20') be directed directly downwardly at the centre of this component, the component 20' is prevented from cracking, which could otherwise be the case, if the surface 18' was to apply a force not perpendicular to the plane of the PCB 12.

Figure 7:
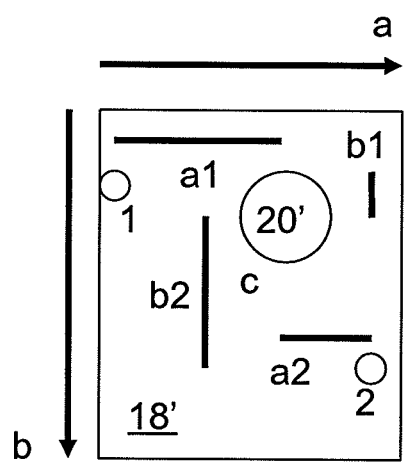
FIG. 7 illustrates positioning of biasing elements.

In FIG. 7, the surface 18' is illustrated as is the extent and position of an element 20' there under. The centre, c, of the surface 18', and that of the element 20' is simple to determine.

The positions of two spring elements 42 are indicated at circles 1 and 2, and two perpendicular directions are indicated by arrows a and b. From these positions, the optimal position of a third and any additional elements 42 may be determined.

Due to it being desired for manufacturing purposes to have all resilient means 42 be identical (within manufacturing limits), the positions of the circles 1 and 2 and further resilient means 42 are determined simply by the distances, projected on to the two directions, from the centre of the component 20' to the positions 1,2 of the springs 42.

More particularly, the combined distances for all springs 42 positioned in one direction, along direction a, from the centre of the component 20' should be identical to or within a predetermined distance of the combined distance for all springs 42 positioned in the opposite direction, along direction a, from the centre of the component 20'.

The same should be true along the direction b, whereby a biasing is obtained using identical springs 42 which provides a force exerted by the surface 18' on the component 20' directed perpendicularly to the surface 18' and thus on the upper surface of the component 20'.

The invention claimed is:

1. An assembly comprising:
 a first PCB having a first side and a second side, one or more first electrical components being positioned at the first side of the first PCB,
 a second PCB with a first side and a second side, one or more second electrical components being positioned at the first side of the second PCB, the first side of the first PCB facing the first side of the second PCB,
 a channel forming element, with at least a part of the first side of the first PCB and at least a part of the first side of the second PCB, forming a channel, the channel having a first end and a second end, a slit being provided in the channel forming element, and
 an air forcing element positioned to force air through the channel from the first end thereof toward the second end thereof, the air forcing element comprising a cooling surface and biasing elements biasing the cooling surface against at least one component of the one or more first components or the one or more second components, the cooling surface defining a space wherein the at least one component is positioned,
 wherein the slit being positioned so that air may be drawn there through, due to a venturi effect, into the space and into the channel.

2. The assembly according to claim 1, further comprising one or more openings positioned at or near the second end of the channel.

3. The assembly according to claim 1, wherein:
 the first PCB has a first outline, the first outline in a plane view thereof,
 the second PCB has a second outline, the second outline in the plane view, at least a part of the first outline and second outline being overlapping, the channel forming element blocking or closing any opening between the first PCB and the second PCB at at least a part of a boundary of the overlapping part of the first and second outlines.

4. The assembly according to claim 1, wherein the first PCB covers a first area, the first area in a plane view thereof, wherein the second PCB covers a second area, the second area in the plane view, the second area being positioned within the first area, and wherein the air forcing element covers a third area, the third area in the plane view, the third area being positioned within a part of the first area not covered by the second area.

5. The assembly according to claim 4, wherein, in the plane view, the air forcing element is positioned closer to the first end of the channel than the second end of the channel.

6. The assembly according to claim 1, wherein the first PCB and the second PCB are substantially parallel.

7. The assembly according to claim 1, wherein the air forcing element comprises a number of fins through which the air entering the channel passes and which are thermally connected to the cooling surface.

8. The assembly according to claim 1, wherein the biasing elements comprise at least three resilient elements having substantially a same spring constant, the at least three resilient elements being positioned so that a force exerted by the biasing elements and the air forcing element on the at least one component are perpendicular to a plane view on the first PCB or second PCB on which the at least one component is positioned.

9. The assembly according to claim 8, wherein
 the first PCB in a plane view thereof,
 the second PCB in plane view, and
 the biasing elements are positioned so that, along each of two axes perpendicular to each other and positioned in the plane view, a first combined distance from a centre of the at least component to each biasing element positioned in one direction along each of two axes in relation to the centre is within a predetermined distance from a second combined distance from the centre to each biasing element positioned in the opposite direction along each of two in relation to the centre.

10. The assembly according to claim 1, wherein the biasing elements abut the channel forming element.

11. A method of operating the assembly of claim 1, the method comprising:
 providing power to the one or more first electrical components of the first PCB,
 providing the power to the one or more second electrical components of the second PCB, and
 operating the air forcing element to force the air from the air forcing element through the first end of the channel and toward the second end of the channel and to draw air through the slit and the space and into the channel.

* * * * *